(12) United States Patent
Kim et al.

(10) Patent No.: US 8,274,840 B2
(45) Date of Patent: Sep. 25, 2012

(54) NONVOLATILE MEMORY DEVICES HAVING BUILT-IN MEMORY CELL RECOVERY DURING BLOCK ERASE AND METHODS OF OPERATING SAME

(75) Inventors: Yong-June Kim, Seoul (KR); Jae-Hong Kim, Seoul (KR); Kyoung-Lae Cho, Gyeonggi-do (KR); Seung-Hwan Song, Gyeonggi-do (KR); Jun-Jin Kong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 100 days.

(21) Appl. No.: 12/498,508

(22) Filed: Jul. 7, 2009

(65) Prior Publication Data

US 2010/0091578 A1 Apr. 15, 2010

(30) Foreign Application Priority Data

Oct. 10, 2008 (KR) .................. 10-2008-0099620

(51) Int. Cl.
*G11C 11/34* (2006.01)
(52) U.S. Cl. ................................. 365/185.33
(58) Field of Classification Search ............ 365/185.29, 365/185.3, 185.33
See application file for complete search history.

(56) References Cited

U.S. PATENT DOCUMENTS

| | | | |
|---|---|---|---|
| 5,745,410 A * | 4/1998 | Yiu et al. ............... | 365/185.3 |
| 5,768,188 A | 6/1998 | Park et al. | |
| 5,862,074 A | 1/1999 | Park | |
| 6,567,316 B1 * | 5/2003 | Ohba et al. ............ | 365/185.3 |
| 7,388,778 B2 | 6/2008 | Hwang | |
| 7,397,698 B2 * | 7/2008 | Fong et al. ............ | 365/185.17 |
| 7,483,301 B2 | 1/2009 | Hwang | |
| 7,969,785 B1 * | 6/2011 | Prabhakar ............ | 365/185.19 |
| 2003/0002345 A1 * | 1/2003 | Avni et al. ............ | 365/185.29 |
| 2007/0165460 A1 * | 7/2007 | Toki et al. ............ | 365/185.22 |

FOREIGN PATENT DOCUMENTS

| | | |
|---|---|---|
| JP | 2004-171686 | 6/2004 |
| KR | 1020040084401 A | 10/2004 |
| KR | 100843037 B1 | 6/2008 |
| KR | 1020080048301 A | 6/2008 |

OTHER PUBLICATIONS

Jung et al., "A 3.3-V Single Power Supply 16-Mb Nonvolatile Virtual DRAM Using a NAND Flash Memory Technology," IEEE Journal of Solid-State Circuits, vol. 32, No. 11, Nov. 1997, pp. 1748-1757.
Takeuchi et al., "A Multipage Cell Architecture for High-Speed Programming Multilevel NAND Flash Memories," IEEE Journal of Solid-State Circuits, vol. 33, No. 8, Aug. 1998, pp. 1228-1238.

* cited by examiner

*Primary Examiner* — Hoai V Ho
*Assistant Examiner* — Anthan Tran
(74) *Attorney, Agent, or Firm* — Myers Bigel Sibley & Sajovec, P.A.

(57) ABSTRACT

Nonvolatile memory devices include support memory cell recovery during operations to erase blocks of nonvolatile (e.g., flash) memory cells. A nonvolatile memory system includes a flash memory device and a memory controller electrically coupled to the flash memory device. The memory controller is configured to control memory cell recovery operations within the flash memory device by issuing a first instruction(s) to the flash memory device that causes erased memory cells in the block of memory to become at least partially programmed memory cells and then issuing a second instruction(s) to the flash memory device that causes the at least partially programmed memory cells become fully erased.

16 Claims, 14 Drawing Sheets

NONVOLATILE MEMORY DEVICES HAVING BUILT-IN MEMORY CELL RECOVERY DURING BLOCK ERASE AND METHODS OF OPERATING SAME

REFERENCE TO PRIORITY APPLICATION

This application claims priority to Korean Application No. 2008-99620, filed Oct. 10, 2008, the disclosure of which is hereby incorporated herein by reference.

FIELD OF THE INVENTION

The present invention relates to integrated circuit memory devices and methods of operating same and, more particularly, to nonvolatile memory devices and methods of operating same.

BACKGROUND OF THE INVENTION

One class of nonvolatile memory devices includes electrically erasable programmable read only memory (EEPROM), which may be used in many applications including embedded applications and mass storage applications. In typical embedded applications, an EEPROM device may be used to provide code storage in personal computers or mobile phones, for example, where fast random access read times may be required. Typical mass storage applications include memory card applications requiring high capacity and low cost.

Figure 1A:
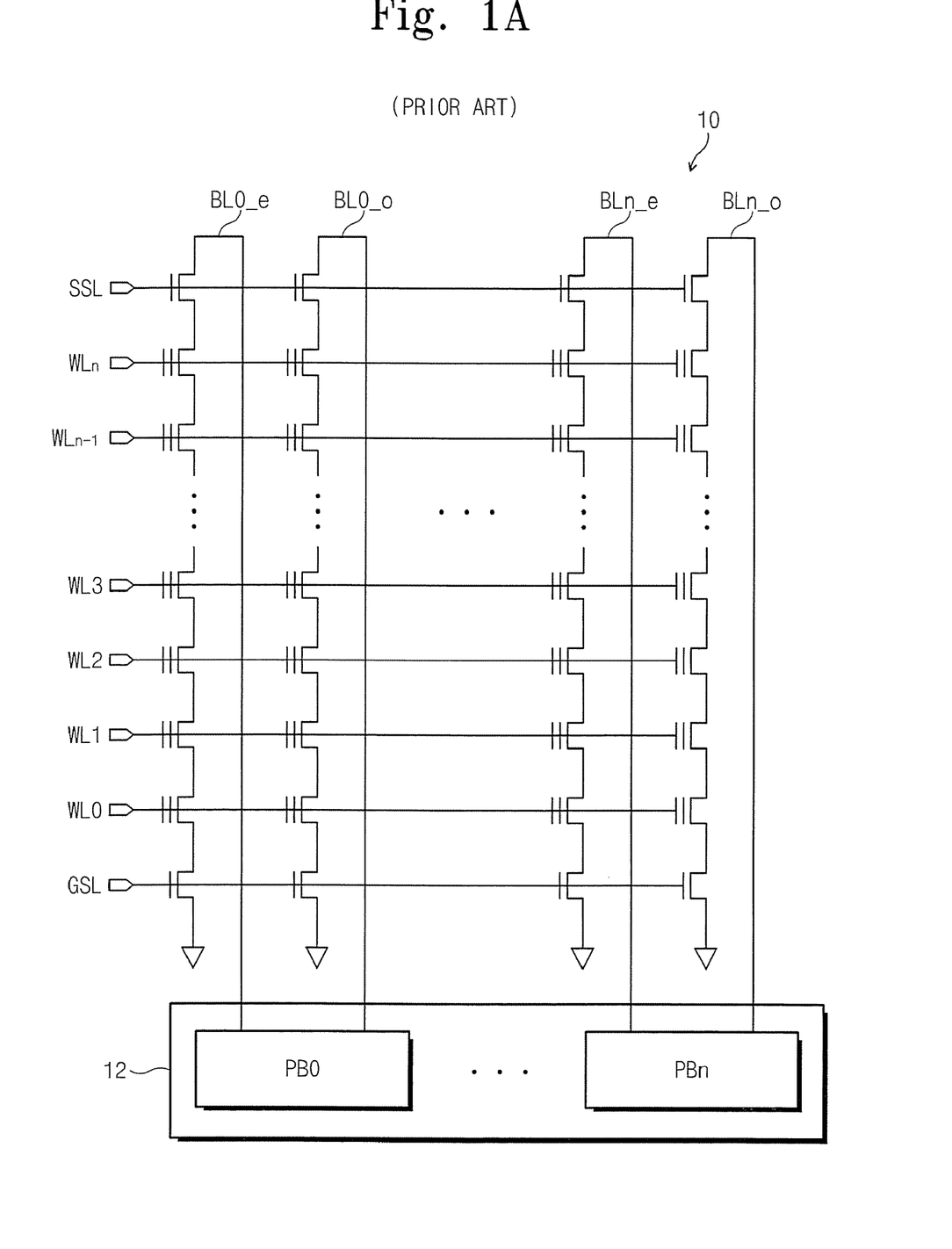
FIG. 1A is an electrical schematic of a conventional nonvolatile memory device having NAND-type strings of EEPROM cells therein.

One category of EEPROM devices includes NAND-type flash memories, which can provide a low cost and high capacity alternative to other forms of nonvolatile memory. FIG. 1A illustrates a conventional flash memory array 10 having a plurality of NAND-type strings therein. Each of these NAND-type strings includes a plurality of EEPROM cells, which are associated with respective even and odd bit lines (BL0_e, BL0_o, . . . , BLn_e, BLn_o). These bit lines are connected to a page buffer 12 having a plurality of buffer circuits (PB0, . . . , PBn) therein. Each EEPROM cell includes a floating gate electrode and a control gate electrode, which is electrically connected to a respective word line (WL0, WL1, . . . , WLn). Access to each NAND string is enabled by driving a string select line (SSL) to a logic 1 voltage during reading and programming operations. Each NAND string also includes a respective ground select transistor, which is electrically connected to a ground select line (GSL).

Figure 1B:
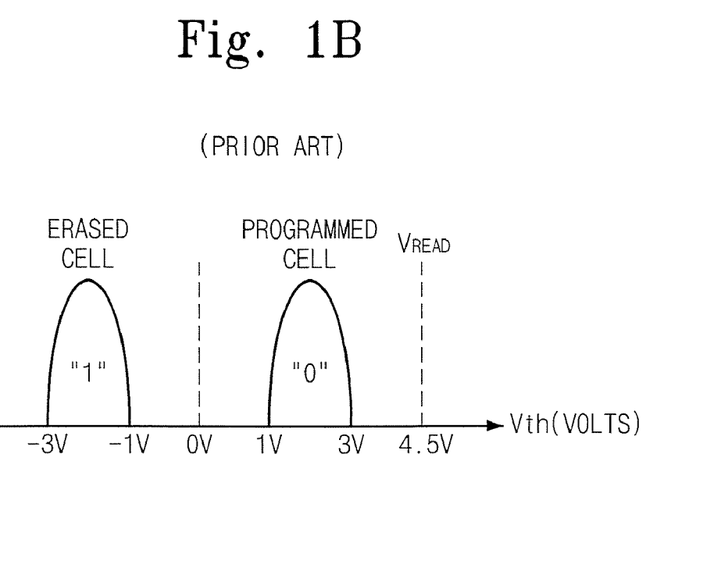
FIG. 1B is a graph illustrating the relative threshold voltages of an erased and programmed EEPROM cell, according to the prior art.
Figure 1C:
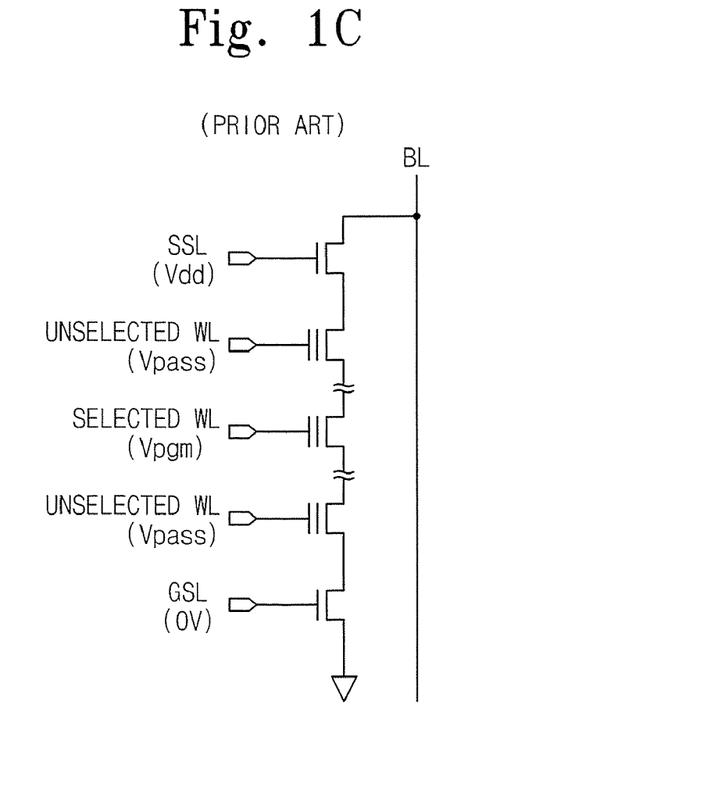
FIG. 1C is an electrical schematic of a NAND-type string of EEPROM cells showing programming bias conditions.

As illustrated by FIG. 1B, the EEPROM cells within the flash memory array 10 of FIG. 1A may be cells that support a single programmed state. EEPROM cells that support only a single programmed state are typically referred to as single level cells (SLC). In particular, an SLC may support an erased state, which may be treated as a logic 1 storage value, and a programmed state, which may be treated as a logic 0 storage value. The SLC may have a negative threshold voltage (Vth) when erased (e.g., $-3V < Vth < -1V$) and a positive threshold voltage when programmed (e.g., $1V < Vth < 3V$). This programmed state may be achieved by setting the bit line BL to a logic 0 value (e.g., 0 Volts), applying a program voltage (Vpgm) to a selected EEPROM cell and applying a pass voltage (Vpass) to the unselected EEPROM cells within a string, as illustrated by FIG. 1C. In addition, during programming the NAND string may be enabled by applying a positive voltage (e.g., power supply voltage Vdd) to the string select line (SSL) and a ground voltage (e.g., 0 Volts) to the ground select line (GSL).

Figure 1D:
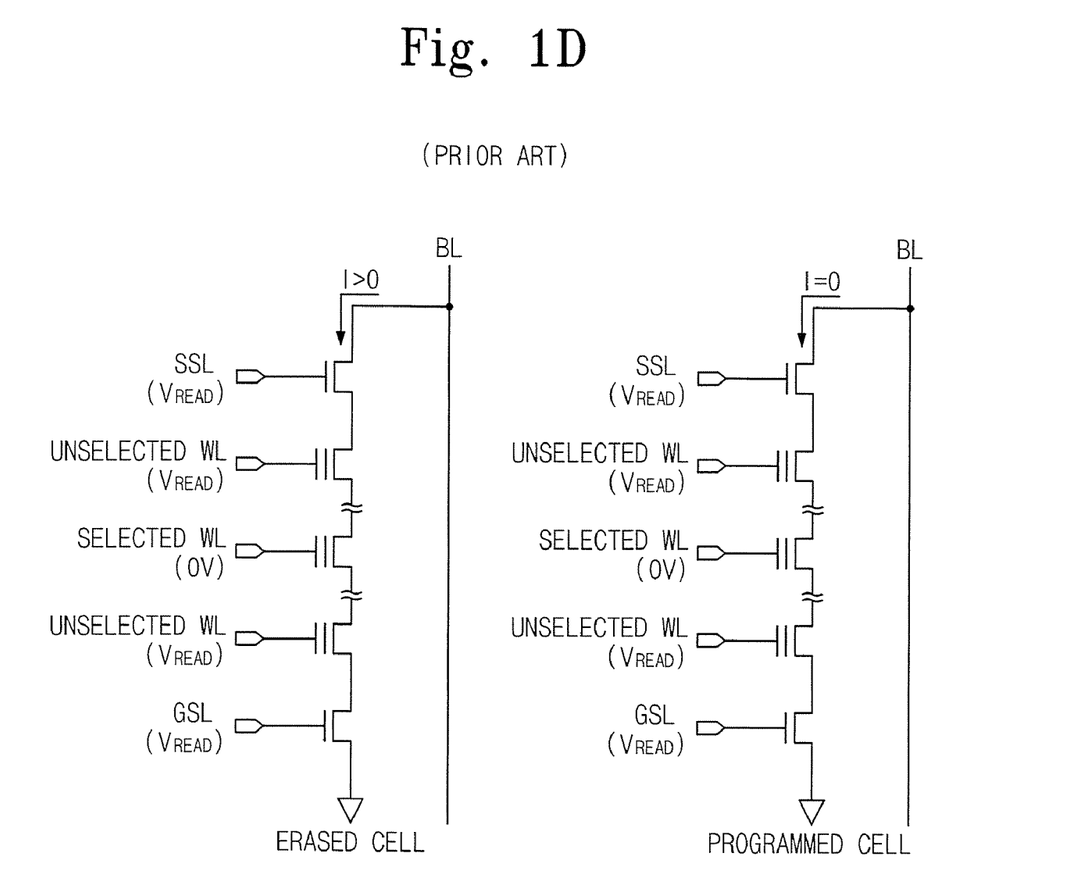
FIG. 1D illustrates current flow in a NAND-type string during operations to read data from an erased EEPROM cell and a programmed EEPROM cell according to the prior art.

Moreover, the programmed state or erased state of an EEPROM cell may be detected by performing a read operation on a selected cell. As illustrated by FIG. 1D, a NAND string will operate to discharge a precharged bit line BL when a selected cell is in an erased state and the selected word line voltage (e.g., 0 Volts) is greater than the threshold voltage of the selected cell. However, when a selected cell is in a programmed state, the corresponding NAND string will provide an open circuit to the precharged bit line BL because the selected word line voltage (e.g., 0 Volts) is less than the threshold voltage of the selected cell and the selected cell remains "off". Other aspects of NAND-type flash memories are disclosed in an article by Jung et al., entitled "A 3.3 Volt Single Power Supply 16-Mb Nonvolatile Virtual DRAM Using a NAND Flash Memory Technology," IEEE Journal of Solid-State Circuits, Vol. 32, No. 11, pp. 1748-1757, November (1997), the disclosure of which is hereby incorporated herein by reference.

Figure 2:
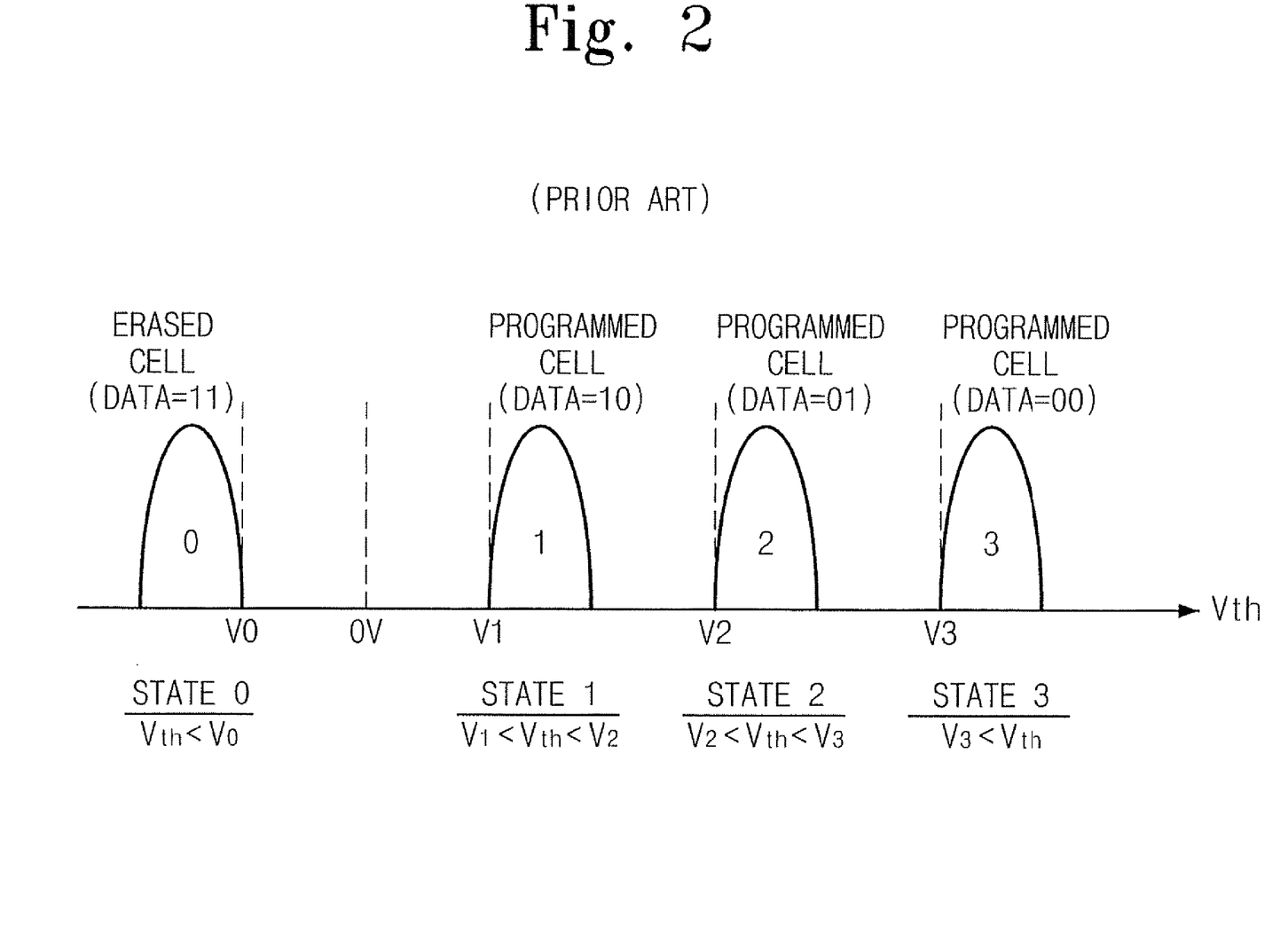
FIG. 2 is a graph illustrating the relative threshold voltages of a four-state EEPROM cell according to the prior art.

EEPROM cells that support multiple programmed states are typically referred to as multi-level cells (MLC). As illustrated by FIG. 2, an MLC that supports an erased state and three different programmed states operates to store two data bits per cell. These and other aspects of an MLC having two data bits per cell is disclosed in an article by Takeuchi et al., entitled "A Multipage Cell Architecture for High-Speed Programming Multilevel NAND Flash Memories," IEEE Journal of Solid-State Circuits, Vol. 33, No. 8, pp. 1228-1238, August (1998). Commonly assigned U.S. Pat. Nos. 5,862,074, 5,768,188, 7,388,778 and 7,483,301 also disclose aspects of multilevel EEPROM cells arranged in a NAND-type configuration, the disclosures of which are hereby incorporated herein by reference.

SUMMARY OF THE INVENTION

Nonvolatile memory systems according to embodiments of the present invention support memory cell recovery during operations to erase blocks of nonvolatile (e.g., flash) memory cells. According to some of these embodiments of the invention, a nonvolatile memory system includes a flash memory device and a memory controller electrically coupled to the flash memory device. The memory controller is configured to control memory cell recovery operations within the flash memory device by issuing a first instruction(s) to the flash memory device that causes erased memory cells in the block of memory to become at least partially programmed memory cells and then issuing a second instruction(s) to the flash memory device that causes the at least partially programmed memory cells become fully erased.

According to further embodiments of the invention, the first instruction(s) can cause one-shot programming of all memory cells in the block of memory, including erased memory cells and previously programmed memory cells, and the second instruction(s) can cause all memory cells within the block of memory to become fully erased, including the at least partially programmed memory cells. According to still further embodiments of the invention, the memory controller may utilize a timer that is activated in response to issuance of the first instruction(s). In particular, the timer may be used by the memory controller to suspend issuance of the second instruction(s) during at least a time interval when the timer is active in response to issuance of the first instruction.

Additional embodiments of the present invention include methods of erasing a block of nonvolatile memory cells in a nonvolatile memory device by initially programming at least one of the nonvolatile memory cells in the block under conditions that cause a threshold voltage of the at least one of the nonvolatile memory cells to increase and then reducing threshold voltages of the at least one of the nonvolatile memory cells and other memory cells in the block to an erased threshold voltage level. This programming of the at least one of the nonvolatile memory cells includes increasing a threshold voltage of a nonvolatile memory cell in the block from an erased threshold voltage level to an at least partially programmed threshold voltage level. This programming of the at least one of the nonvolatile memory cells may also include increasing a threshold voltage of at least one already programmed nonvolatile memory cell in the block, such as during a one-shot programming operation.

Methods of operating nonvolatile memory devices according to still further embodiments of the invention include performing a block erase operation on a block of nonvolatile memory cells in the memory device by at least partially programming at least one erased memory cell in the block in advance of rendering all memory cells in the block as erased memory cells. For example, this performing a block erase operation may include executing a one-shot program operation by at least partially programming all memory cells in the block in advance of erasing all memory cells in the block.

According to still further embodiments of the invention, a method of operating a nonvolatile memory device includes performing a block erase operation on a block of nonvolatile memory cells in the memory device by performing a memory cell recovery operation on the block of nonvolatile memory cells in advance of erasing the block of nonvolatile memory cells. This memory cell recovery operation includes programming a first plurality of erased memory cells in the block to a first programmed state using a first verify voltage to confirm the programming and then further programming the first plurality of non-voltage memory cells within the first programmed state to achieve a narrower threshold voltage variation therein using a second verify voltage to confirm the further programming. The step of programming the first plurality of nonvolatile memory cells in the block may be preceded by erasing all of the first plurality of nonvolatile memory cells in the block.

DETAILED DESCRIPTION OF PREFERRED EMBODIMENTS

The present invention will now be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Figure 3A:
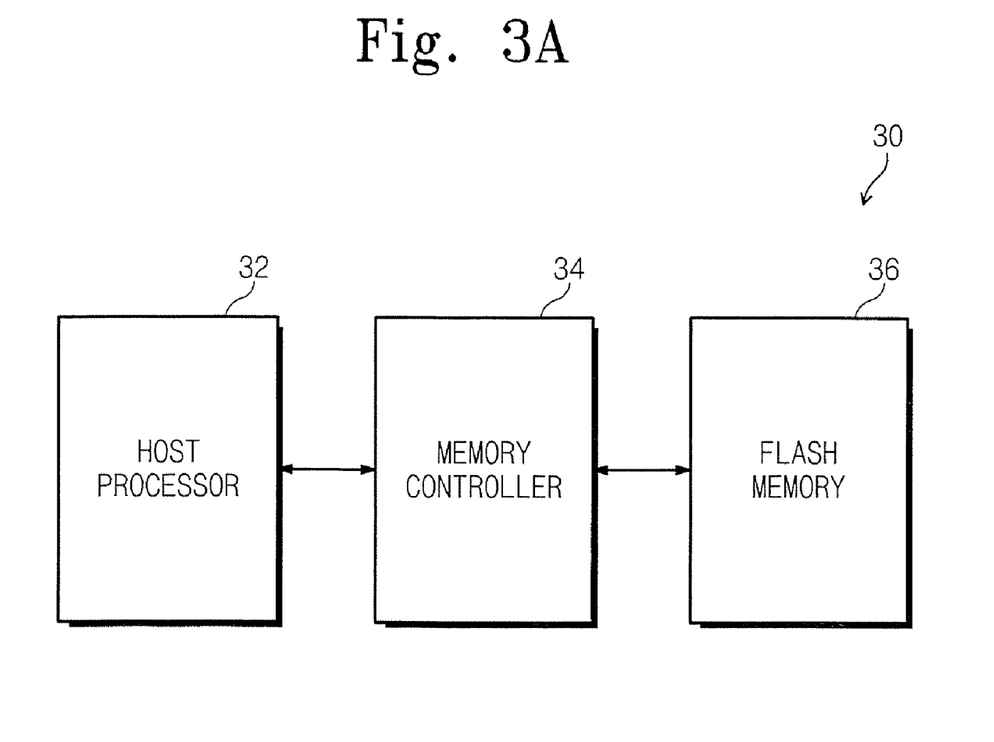
FIG. 3A is a block diagram of an non-volatile memory system according to embodiments of the present invention.

FIG. 3A illustrates a nonvolatile memory system 30 according to embodiments of the present invention, which includes a memory controller 34 and a nonvolatile memory (e.g., flash memory) device 36. As illustrated, the memory controller 34 is electrically coupled to the nonvolatile memory device 36. As will be understood by those skilled in the art, the memory controller 34 can be configured to provide, among other things, instructions/commands, configuration information and write data to the nonvolatile memory device 36 and receive read data and other information from the memory device 36. In addition, as described more fully hereinbelow, the memory controller 34 is configured to control memory cell recovery operations within the memory device 36 during operations to erase one or more memory blocks therein. The memory controller 34 may also be configured to communicate with a host processor 32 using conventional techniques. The memory cell recovery operations described herein may operate to increase memory device lifetime and reliability by reducing a likelihood that memory cells may become over-erased after experiencing repeated program/erase cycles. In particular, the recovery operations take advantage of the fact that the recovery effect associated with a programmed memory cell is more significant than the recovery effect associated with an erased memory cell.

Figure 3B:
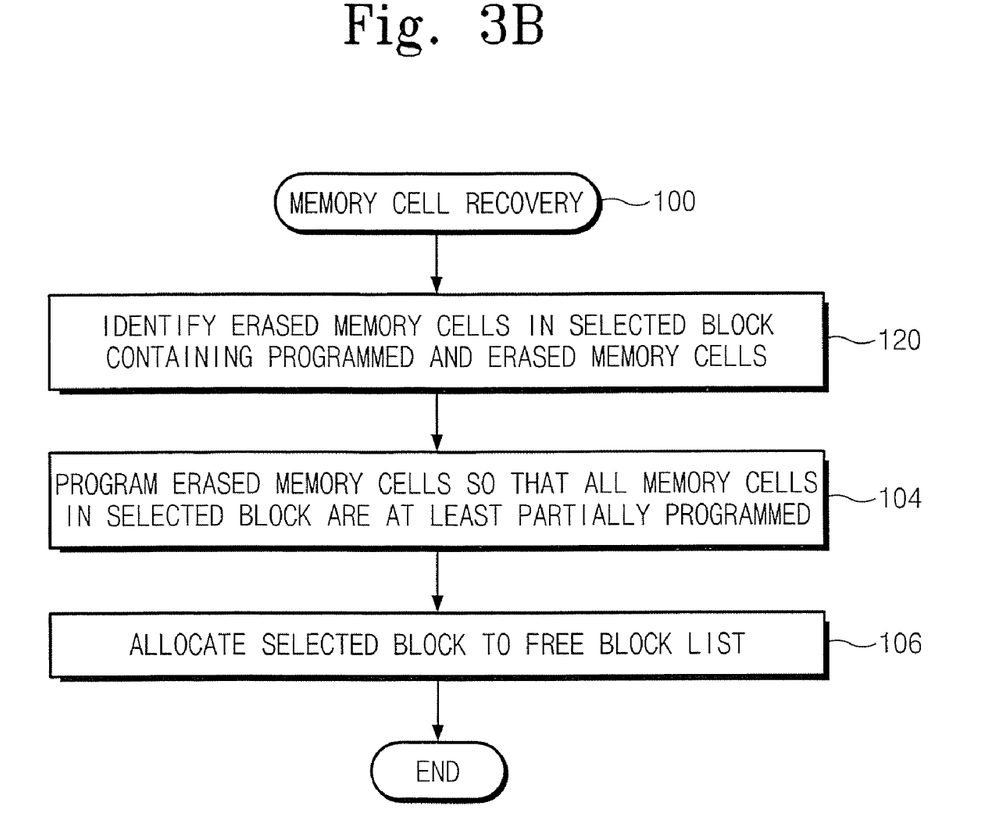
FIG. 3B is a flow-diagram of operations performed by a non-volatile memory system, according to embodiments of the present invention.

These memory cell recovery operations include the memory cell recovery operations 100 of FIG. 3B. In particular, the recovery operations 100 of FIG. 3B include an operation 102 to identify erased memory cells in a nonvolatile memory cell block selected for block erasure (e.g., by a memory controller). Thereafter, an operation 104 is performed to at least partially program the erased memory cells within the block by increasing the threshold voltages of the erased memory cells. This programming operation is performed so that all memory cells in the block are at least partially programmed before any subsequent block erasure operation is performed. This operation 104 to at least partially program the erased memory cells within a block selected for erasure may then be followed by an operation 106 to allocate the selected memory block to a free block list, which indicates that the block is available for erasure (e.g., flash erasure) using conventional or other erasure techniques that may be controlled by the memory controller 34.

As will be understood by those skilled in the art, operations to allocate a memory block to a free block list may utilize firmware to manage the free block list by classifying memory blocks into a garbage queue first before allocating them to a ready queue. However, in accordance with the embodiments of the present invention, as described herein, the memory blocks in the garbage queue undergo the recovery operations described herein in advance of being erased an allocated to the ready queue for subsequent use (i.e., programming).

Figure 4A:
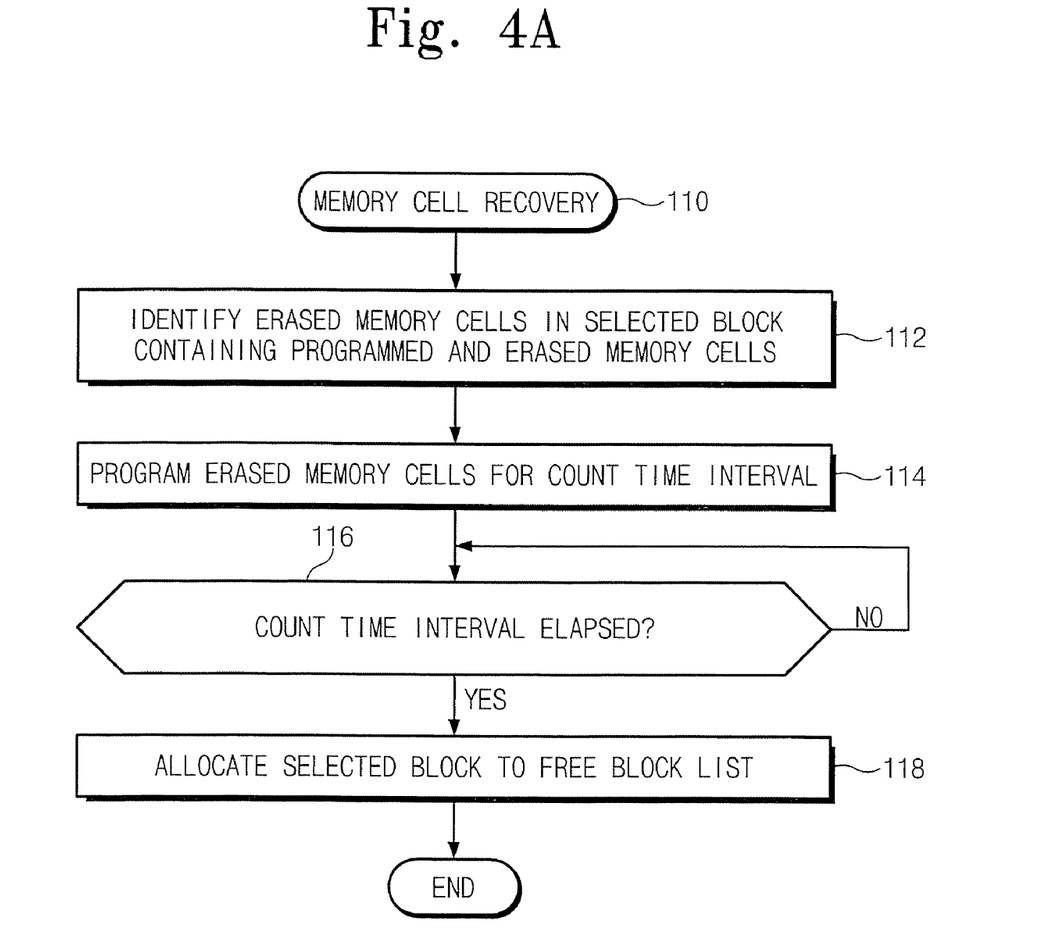
FIG. 4A is a flow-diagram of operations performed by a non-volatile memory system, according to embodiments of the present invention.
Figure 4B:
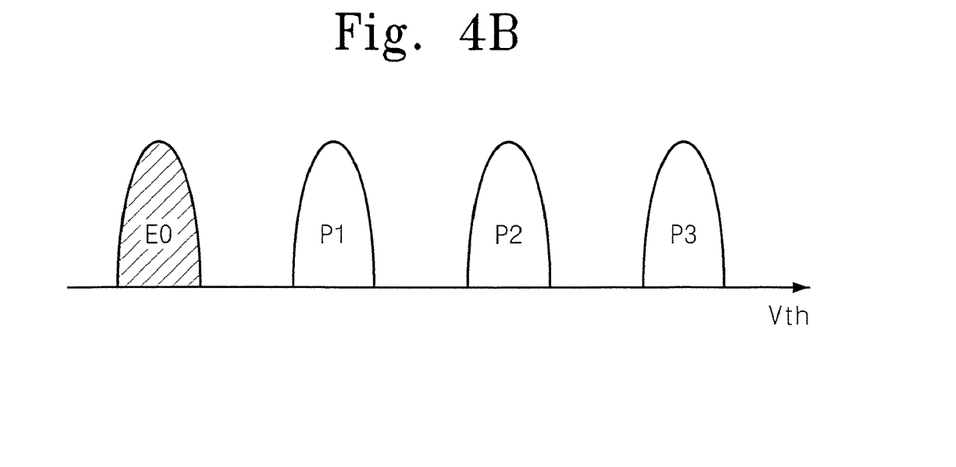
FIGS. 4B-4D illustrate memory cell recovery operations according to embodiments of the present invention.

Referring now to FIG. 4A, memory cell recovery operations 110 according to additional embodiments of the present invention include an operation 112 to identify erased memory cells in a selected block of nonvolatile memory cells containing both previously programmed memory cells and at least some unprogrammed (i.e., erased) memory cells. Thereafter, an operation 114 is performed to program the erased memory cells for a predetermined "count" time interval, which may be a fixed or programmable time interval measured by a counter (not shown). This count time interval may correspond to a time interval during which a program word line voltage (e.g., Vpgm) is applied to a selected word line(s) within the selected block. As illustrated by decision block 116, once the count time interval has elapsed, an operation 118 may be performed to allocate the selected block of memory cells to a free block list, which identifies the block as an available block to be erased (e.g., flash erased) prior to reuse. These operations of FIG. 4A are further highlighted by FIGS. 4B and 4C. In particular, FIG. 4B illustrates a plurality of threshold voltage (Vth) ranges for 2-bit nonvolatile memory cells (e.g., EEPROM cells). These threshold voltage ranges include: E0, corresponding to erased memory cells; P1, corresponding to memory cells programmed to a first programmed state; P2, corresponding to memory cells programmed to a second programmed state; and P3, corresponding to memory cells programmed to a third programmed state. Thus, as will be understood by those skilled in the art, these erased and programmed states E0, P1, P2 and P3 may correspond to those illustrated by FIG. 2, for the case of 2-bit nonvolatile memory cells.

Figure 4C:
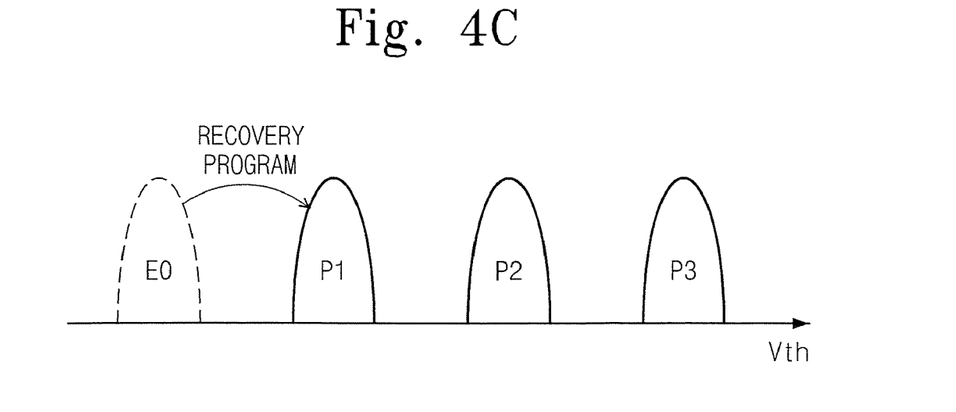
Figure 4D:
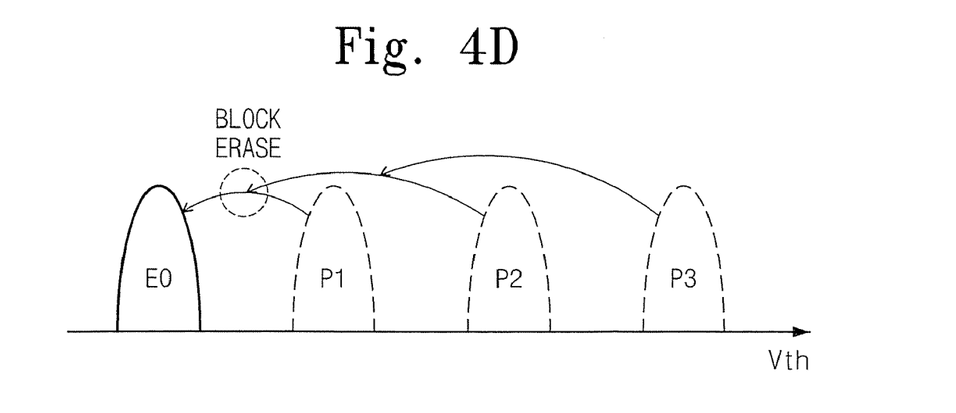

FIG. 4C illustrates a program recovery operation, which includes programming erased memory cells to the first programmed state P1. However, according to alternative embodiments of the invention, the program recovery operation need not fully program the erased memory cells to the first programmed state P1. For example, the count time interval illustrated by Blocks 114 and 116 in FIG. 4A may be sufficient to program an erased memory cell to an undefined state that is higher than the erased state, but less than or intermediate a fully programmed state. Alternatively, the program recovery operation may include programming erased memory cells to program states beyond the first programmed state (e.g., states P2, P3).

The operations illustrated by FIG. 4C may be followed by the operation 118 to allocate the selected memory block to a free memory block list. Once allocated to the free memory block list, conventional erase operations (e.g., flash) may be performed to reset the programmed states (i.e., P1, P2 and P3) of the memory cells in the block, under control of the memory controller 34. Although not wishing to be bound by any theory, it is believed that each memory block allocated to a free memory block list should be placed at a bottom of the list so that a maximum amount of time occurs between initial allocation to the list and the ultimate erasure of the listed block and a maximum recovery effect can be achieved.

Figure 5A:
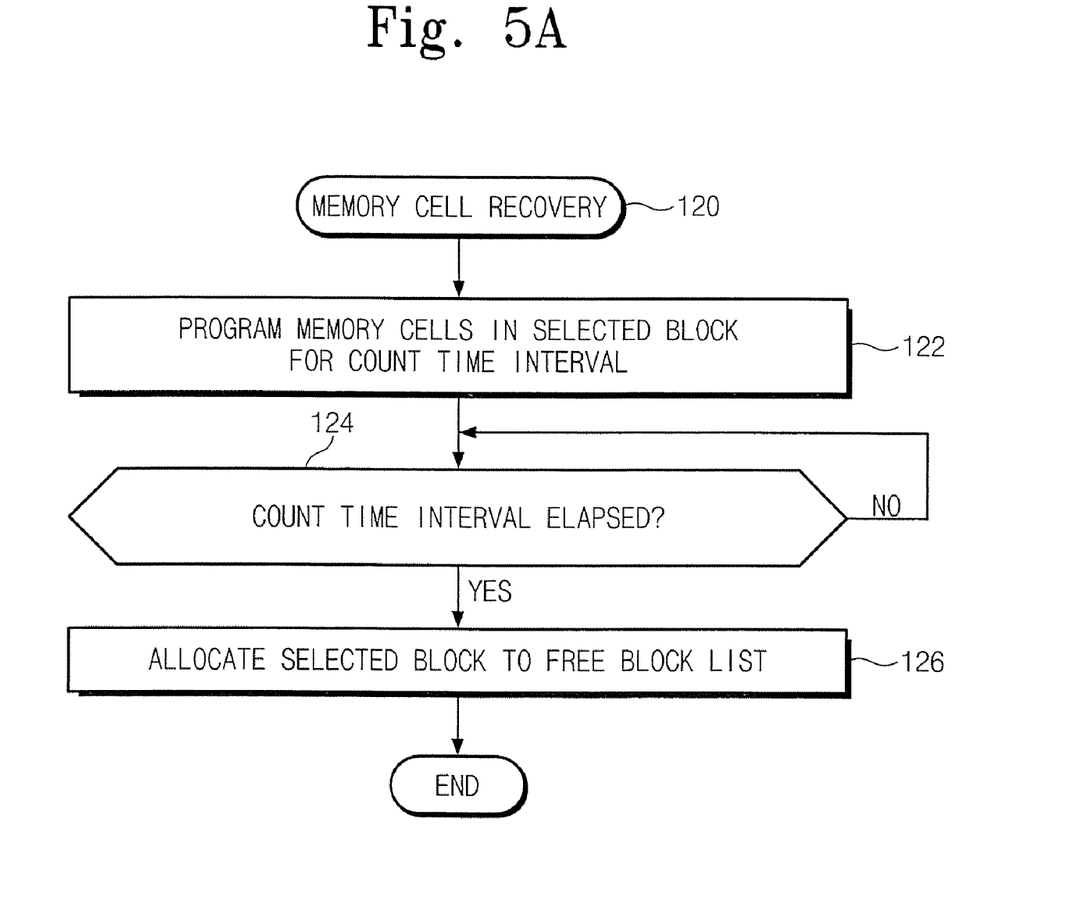
FIG. 5A is a flow-diagram of operations performed by a non-volatile memory system, according to embodiments of the present invention.

Referring now to FIG. 5A, memory cell recovery operations 120 according to additional embodiments of the present invention include an operation 122 to program all nonvolatile memory cells within a block selected for erasure for a predetermined time interval. This programming of all nonvolatile memory cells for a predetermined time interval may be treated as a "one-shot" program operation, which may include simultaneously driving a plurality of word lines in the selected memory block at program voltages (Vpgm) while concurrently biasing bit lines associated with columns of memory cells in the block at equivalent bit line voltages that support programming. This time interval may be set by a timer, Block 124, which specifies a duration sufficient to at least partially program all erased memory cells within the selected block. Upon termination of the time interval, an operation 126 is performed to allocate the selected block to a free block list.

Figure 5B:
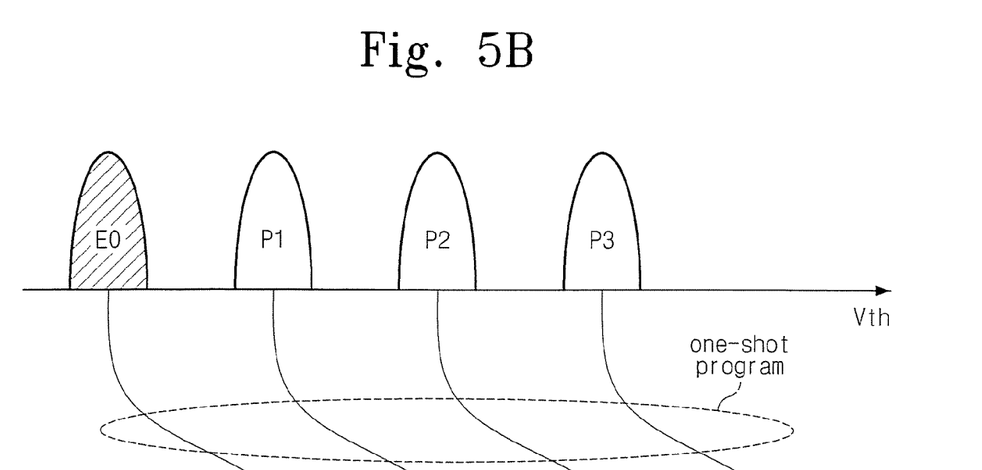
FIGS. 5B-5D illustrate memory cell recovery operations according to embodiments of the present invention.
Figure 5C:
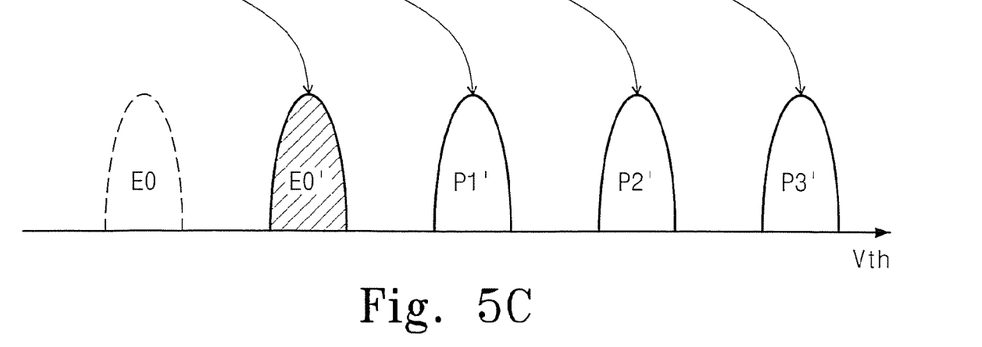
Figure 5D:
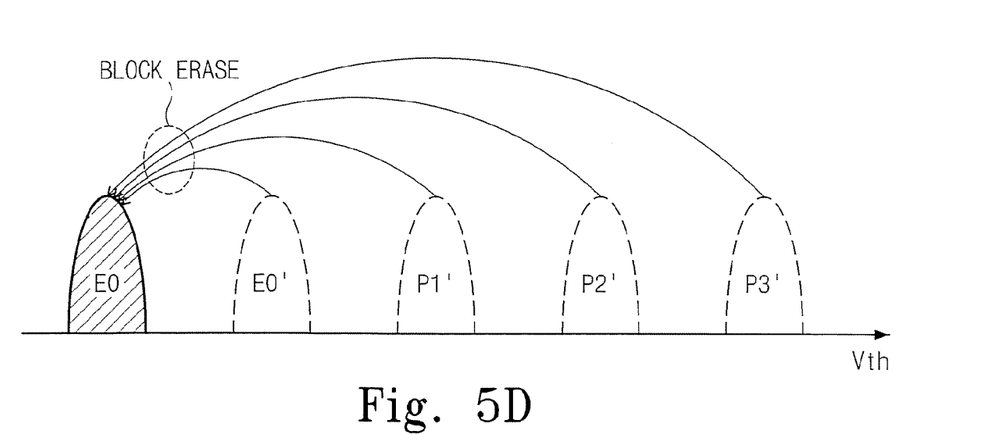

FIG. 5B illustrates the relative threshold voltages of memory cells within a selected block that remain erased (E0) or have been programmed to one of three programmed states (P1, P2 and P3). FIG. 5C illustrates the increased threshold voltages of the memory cells after a one-shot program operation has been performed on all memory cells within the selected block. This one-shot program operation can be performed to reduce the likelihood that erased memory cells within a block may become "over-erased" by virtue of being subjected to repeated erase cycles without undergoing sufficient programming cycles. Finally, FIG. 5D illustrates the changes in threshold voltages that occur when a block erase operation is performed to erase all memory cells within a block after the block has been allocated to a free block list.

Figure 6A:
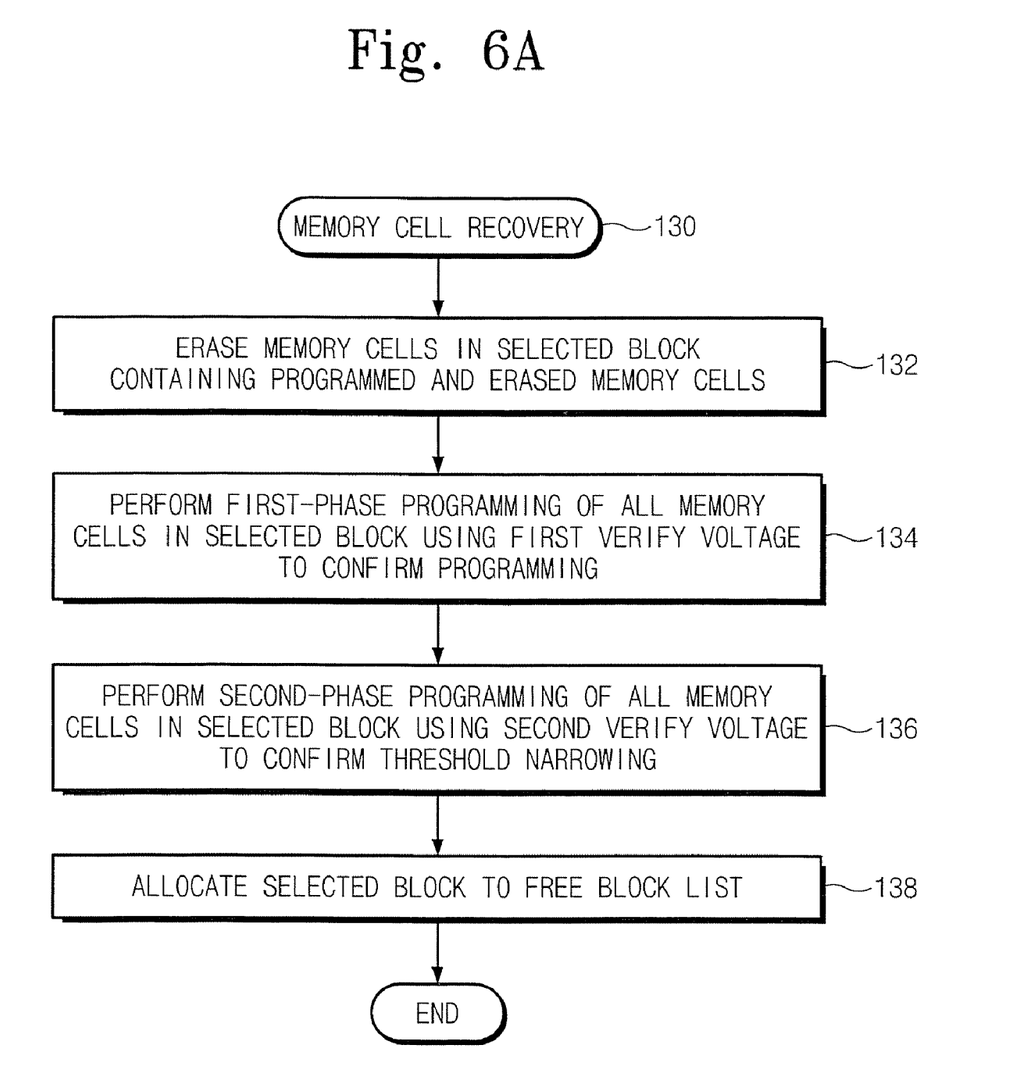
FIG. 6A is a flow-diagram of operations performed by a non-volatile memory system, according to embodiments of the present invention.
Figure 6B:
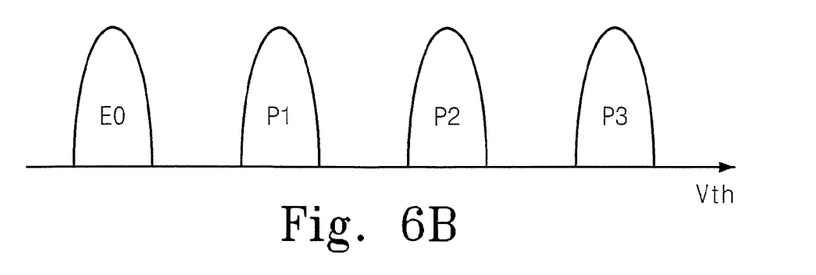
FIGS. 6B-6E illustrate memory cell recovery operations according to embodiments of the present invention.
Figure 6C:
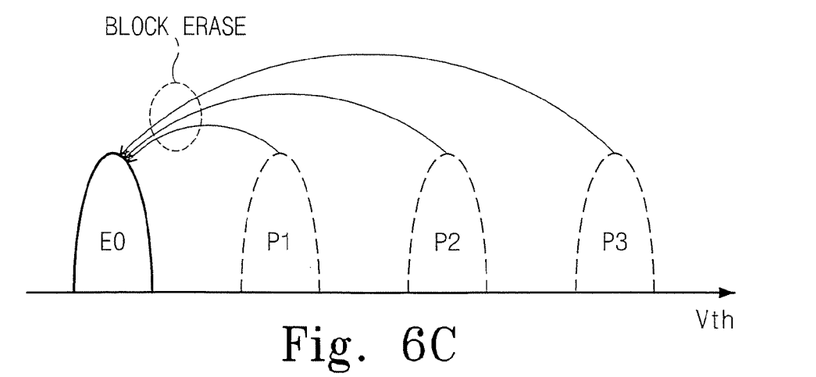
Figure 6D:
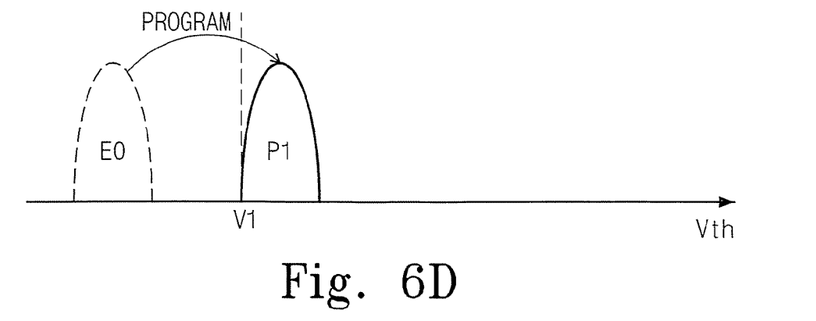
Figure 6E:
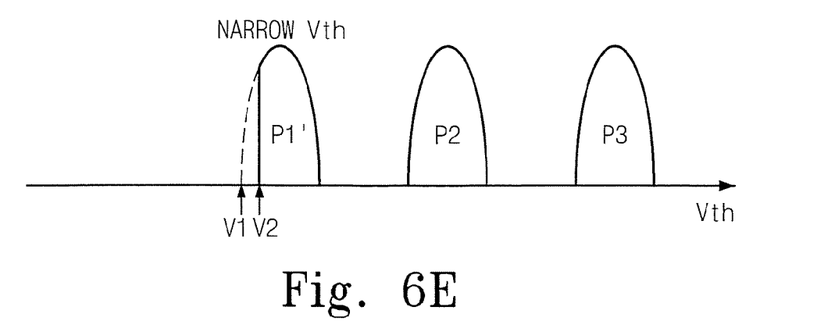

Referring now to FIG. 6A, memory cell recovery operations 130 according to still further embodiments of the present invention include an operation 132 to erase memory cells within a selected block containing programmed and erased memory cells. Thereafter, a first phase programming operation 134 is performed on all memory cells within the block using a first verify voltage (V1) to confirm that all memory cells have been sufficiently programmed (e.g., to program state P1). Following the first phase programming operation, the threshold voltages of the programmed memory cells are narrowed so that these cells will have more uniform characteristics during repeated program/erase cycles. In particular, a second phase programming operation 136, which may have a relatively short duration, is performed to narrow the variation of threshold voltages of the memory cells within the program state (e.g., program state P1) established by the first phase programming. This second phase programming operation 136 may be performed using a second verify voltage (V2) to verify the narrowing of the threshold voltage variation. An operation 138 to allocate the selected memory block to a free block list is then performed to identify the selected memory block as one that is available for erasure using conventional block erase operations (e.g., flash erase). FIGS. 6B-6E further illustrate the memory cell recovery operations 130 of FIG. 6A. In particular, FIGS. 6B-6C illustrate operations 132 to erase all memory cells within the selected memory block using a conventional block erase operation (e.g., flash erase). Thereafter, as illustrated by FIG. 6D, all memory cells within the selected block are programmed to an equivalent program state, using a first verify voltage (e.g., V1) to set a minimum threshold voltage for the programmed cells. In some cases, this equivalent program state may be the first programmed state (e.g., P1), as illustrated. However, other equivalent degrees of programming may also be used, including those that are insufficient to reach the first programmed state P1. Finally, as illustrated by FIG. 6E, a second phase programming operation is performed to increase the lower-end threshold voltages of the memory cells in the previously established program state. This second phase programming includes using a second verify voltage (e.g., V2>V1) to set the minimum program voltage within the narrower range of program voltages, shown as P1'.

Figure 7A:
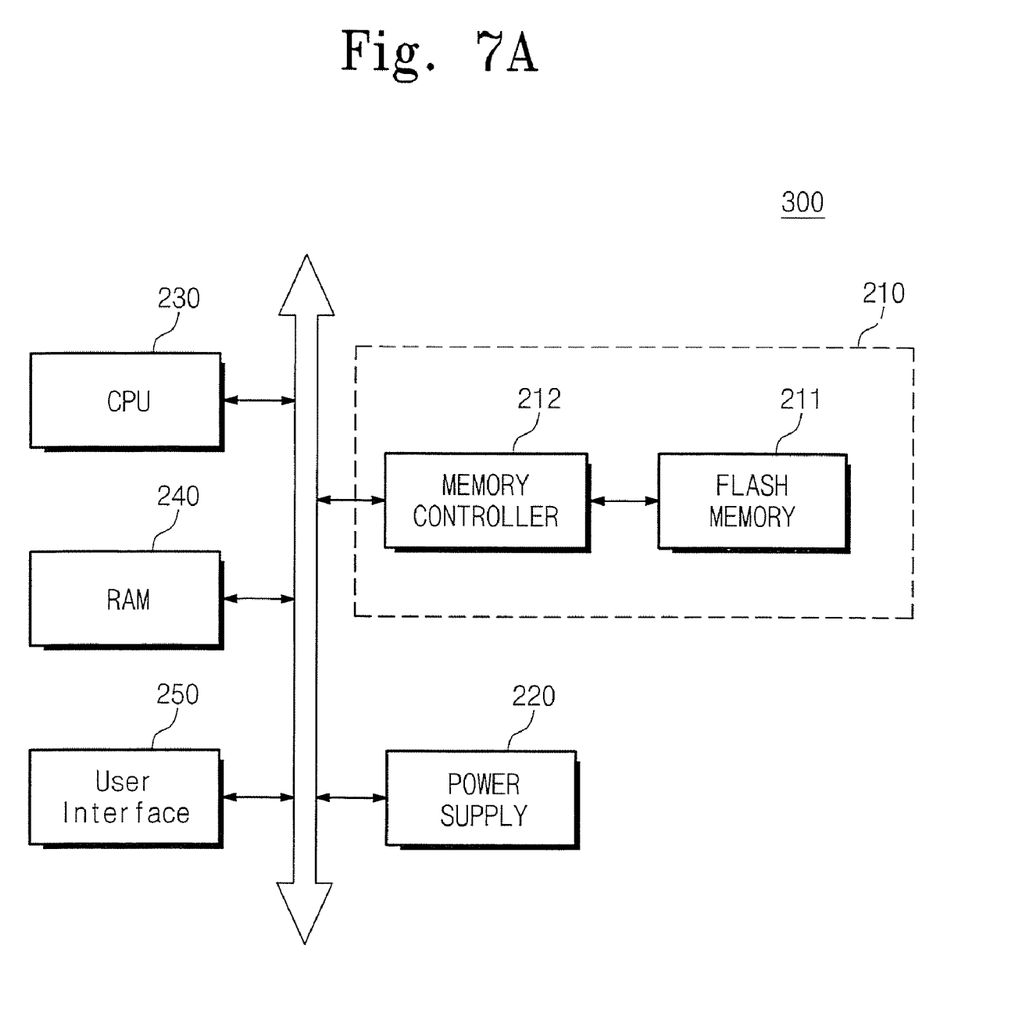
FIG. 7A is a block diagram of a memory system, according to embodiments of the present invention.

FIG. 7A is a block diagram of a memory system 200 that may include a nonvolatile memory device according to embodiments of the present invention. This system 200 is illustrated as including a nonvolatile memory system 210, such as the memory system 30 of FIG. 3A. This nonvolatile memory system 210 includes a memory controller 212 and a flash memory device 211. The memory controller 212, which may be configured to perform the memory cell recovery operations described herein, is electrically coupled to other components within the memory system 200. These other components include a central processing unit 230, volatile memory 240 (e.g., RAM), a user interface 250 and a power supply 220.

Figure 7B:
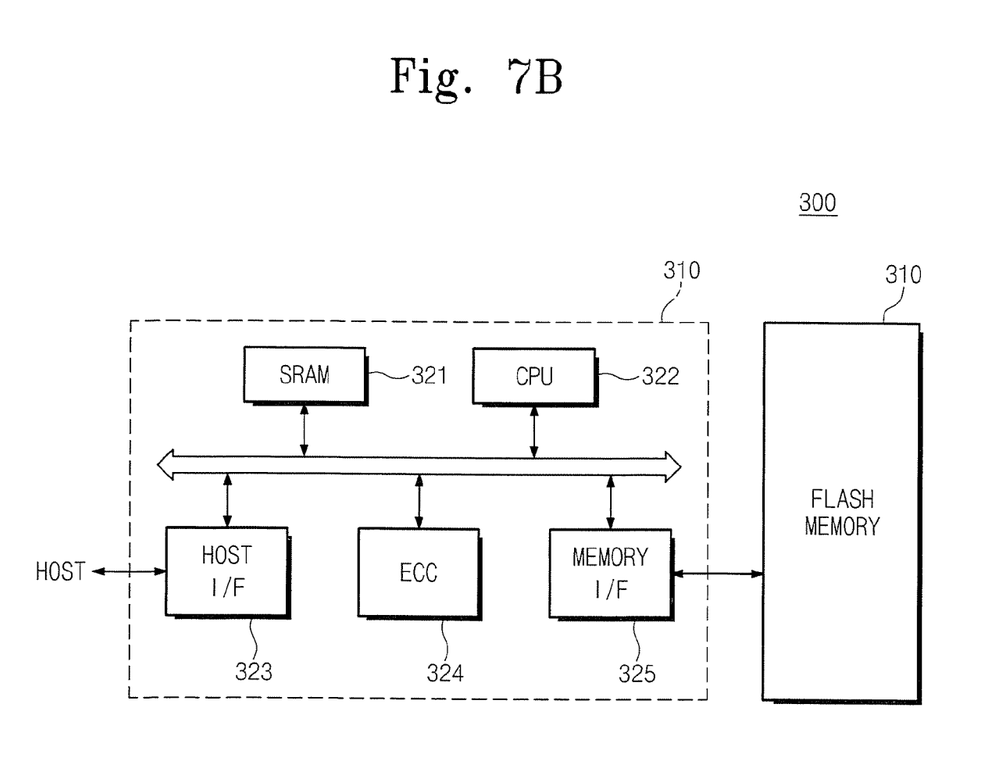
FIG. 7B is a block diagram of a memory system, according to embodiments of the present invention.

FIG. 7B is a block diagram of a memory system 300 that may include a nonvolatile memory device according to embodiments of the present invention. This system 300 is illustrated as including a flash memory system 310, such as the memory system 30 of FIG. 3A. This flash memory system 310 is illustrated as communicating with an external memory interface system 320. The interface system 320 is illustrated as including a memory interface circuit 325, which is electrically coupled to a central bus. Other components connected to this central bus include a central processing unit 322, a volatile memory device 321 (e.g., SRAM), an error correction circuit 324 (ECC) and a host interface circuit 323.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of operating a nonvolatile memory device, comprising:
    programming at least one memory cell in a memory block designated as an erase block to avoid presence of any memory cell in the memory block having a threshold voltage corresponding to an erased state, said programming the at least one memory cell occurring for a time interval having a duration sufficiently long to achieve at least partial recovery of an insulating characteristic in a tunneling oxide layer(s) of the at least one memory cell; and
    erasing the memory block to become fully erased after said programming the at least one memory cell.

2. The method of claim 1, wherein the programming the at least one memory cell in the memory block comprises selectively increasing the threshold voltage corresponding to the erase state to a partially programmed threshold voltage.

3. The method of claim 2, wherein the programming the at least one memory cell in the memory block comprises increasing threshold voltages of all memory cells in the memory block regardless of initial states before the programming.

4. The method of claim 2, further comprising:
    measuring the duration of the time interval using a counter.

5. A method of operating a nonvolatile memory device, comprising:
    programming at least one memory cell in a memory block designated as an erase block to avoid presence of any memory cell in the memory block having a threshold voltage corresponding to an erased state, said programming the at least one memory cell occurring for a time interval having a duration sufficiently long to achieve at least partial recovery of an insulating characteristic in a tunneling oxide layer(s) of the at least one memory cell; and then
    assigning the memory block as a free block.

6. The method of claim 5, wherein the programming the at least one memory cell in the memory block comprises selectively increasing the threshold voltage corresponding to the erase state to a partially programmed threshold voltage.

7. The method of claim 5, wherein the programming the at least one memory cell in the memory block comprises increasing threshold voltages of all memory cells in the memory block regardless of initial states before the programming.

8. The method of claim 5, further comprising:
    measuring the duration of the time interval using a counter.

9. A nonvolatile memory system, comprising:
    a flash memory device; and
    a memory controller electrically coupled to the flash memory device, the memory controller configured to perform a memory cell recovery operation on a memory block that is designated as an erase block,
    wherein the memory cell recovery operation includes:
        programming at least one memory cell in the memory block designated as an erase block to avoid presence of any memory cell in the memory block having a threshold voltage corresponding to an erased state, said programming the at least one memory cell occurring for a time interval having a duration sufficiently long to achieve at least partial recovery of an insulating characteristic in a tunneling oxide layer(s) of the at least one memory cell; and then
        erasing the memory block to become fully erased and/or assigning the memory block as a free block list.

10. The nonvolatile memory system of claim 9, wherein the programming the at least one memory cell is performed by selectively programming an erased memory cell in the memory block from an erased state to into a programmed state.

11. The nonvolatile memory system of claim 9, wherein the programming the at least one memory cell is performed using a one-shot program operation to program all memory cells in the memory block with a single program voltage pulse.

12. The nonvolatile memory system of claim 11, wherein during the one-shot program operation, a program verifying procedure is skipped.

13. The nonvolatile memory system of claim 9, wherein the memory controller comprises a timer that is activated in response to completion of the programming the at least one memory cell.

14. The nonvolatile memory system of claim 13, wherein the memory controller is configured to suspend erasing or assigning the memory block during the time interval by reference to a time count value of the timer.

15. The nonvolatile memory system of claim 9, wherein the memory controller designate the memory block as the erased block in consequence of a garbage collection.

16. The nonvolatile memory system of claim 9, wherein a duration that a program word line voltage is applied to a selected word line within the memory block during the time interval.

* * * * *